United States Patent
McCormick (12)

(10) Patent No.: US 6,706,622 B1
(45) Date of Patent: Mar. 16, 2004

(54) BONDING PAD INTERFACE

(75) Inventor: John P. McCormick, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/949,207

(22) Filed: Sep. 7, 2001

(51) Int. Cl.$^7$ .............................................. H01L 21/44
(52) U.S. Cl. ...................... 438/614; 438/612; 438/613; 438/653
(58) Field of Search ................. 438/612, 613, 438/614, 653

(56) References Cited

U.S. PATENT DOCUMENTS

| | | | |
|---|---|---|---|
| 6,180,505 B1 * | 1/2001 | Uzoh ........................ | 438/614 |
| 6,358,831 B1 * | 3/2002 | Liu et al. ................... | 438/612 |
| 6,403,457 B2 * | 6/2002 | Tandy ........................ | 438/613 |
| 6,444,568 B1 * | 9/2002 | Sundararajan et al. ...... | 438/627 |
| 6,458,690 B2 * | 10/2002 | Takewaki et al. .......... | 438/637 |

* cited by examiner

Primary Examiner—Amir Zarabian
Assistant Examiner—Christy Novacek
(74) Attorney, Agent, or Firm—Luedeka, Neely & Graham

(57) ABSTRACT

A method for providing under bump metallization on a substrate. Trenches are formed in the substrate, and a layer of first electrically conductive material is formed over the substrate. The layer of the first electrically conductive material substantially fills the trenches and substantially covers the substrate between the trenches in a contiguous sheet. The layer of the first electrically conductive material is thinned to an end point where the layer of the first electrically conductive material is substantially reduced in thickness, but still forms the contiguous sheet between the trenches. A layer of photoresist is applied over the layer of the first electrically conductive material to define openings. A second electrically conductive material is deposited into the openings. The photoresist layer is removed, and the layer of the first electrically conductive material in the contiguous sheet between the trenches is removed to isolate the first electrically conductive material in the trenches. Because the layer of the first electrically conductive material is not completely removed in the areas between the trenches, the first electrically conductive material may be used as an electrode for the electroplate deposition of the second electrically conductive material. Thus, the under bump metallization can be produced in a more economical manner. If the layer of the first electrically conductive material were to be thinned to the point where the first electrically conductive material was only left in the trenches, then it would not be feasible to used the layer of the first electrically conductive material as an electrode, and thus it would further not be feasible to electroplate the second electrically conductive material.

18 Claims, 2 Drawing Sheets

BONDING PAD INTERFACE

FIELD

This invention relates to the field of integrated circuit processing. More particularly, this invention relates to methods for application of an under bump metallization.

BACKGROUND

Flip-chip integrated circuits typically have bond pads that align with bond pads on a substrate such as a circuit board or package. The bond pads of the integrated circuit are connected to the corresponding bond pads on the substrate with electrical connections called bumps. In some bumping processes, such as solder bumping processes, an under bump metallization is initially provided on the integrated circuit bond pads.

The under bump metallization is typically used for any one or more of a number of different features, including keeping various materials separated, where the different materials may not be compatible with each other if they are allowed to come into direct contact with each other. Other features include those such as wettability, adhesion, and corrosion resistance.

The under bump metallization is typically formed with a physical vapor deposition process, such as sputtering or evaporation. However, these processes tend to be relatively expensive.

What is needed, therefore, is a method for forming under bump metallization.

SUMMARY

The above and other needs are met by a method for providing under bump metallization on a substrate. Trenches are formed in the substrate, and a layer of first electrically conductive material is formed over the substrate. The layer of the first electrically conductive material substantially fills the trenches and substantially covers the substrate between the trenches in a contiguous sheet. The layer of the first electrically conductive material is thinned to an end point where the layer of the first electrically conductive material is substantially reduced in thickness, but still forms the contiguous sheet between the trenches.

A layer of photoresist is applied over the layer of the first electrically conductive material to define openings. A second electrically conductive material is deposited into the openings. The photoresist layer is removed, and the layer of the first electrically conductive material in the contiguous sheet between the trenches is removed to isolate the first electrically conductive material in the trenches.

Because the layer of the first electrically conductive material is not completely removed in the areas between the trenches, the first electrically conductive material may be used as an electrode for the electroplate deposition of the second electrically conductive material. Thus, the under bump metallization can be produced in a more economical manner. If the layer of the first electrically conductive material were to be thinned to the point where the first electrically conductive material was only left in the trenches, then it would not be feasible to used the layer of the first electrically conductive material as an electrode, and thus it would further not be feasible to electroplate the second electrically conductive material.

In various preferred embodiment of the invention, a barrier layer is first formed over the substrate. The barrier layer is most preferably a composite layer of tantalum and tantalum nitride. A seed layer is preferably formed over the barrier layer. Preferably, the seed layer is formed of the first electrically conductive material, which is most preferably copper. The second electrically conductive material is preferably nickel, which isolates the copper from other material which may degrade the copper, or which may be degraded by the copper.

In an especially preferred embodiment, a third electrically conductive material is deposited in the openings in the photoresist layer. Most preferably, the third electrically conductive material is either gold or solder. The gold and solder protect the nickel. However, if the third electrically conductive material is solder, then the second electrically conductive material of nickel may not be needed.

The layer of the first electrically conductive material is preferably formed by electroplating, using the underlying layers as electrodes. The layer of the first electrically conductive material is preferably thinned using a chemical mechanical polishing process.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The invention advantageously enables cost reduction in the provision of under bump metallization that is particularly suitable for use in the manufacture of flip-chip integrated circuits. Die treated in accordance with the invention are particularly suitable for bumping as by application of solder.

Figure 1:
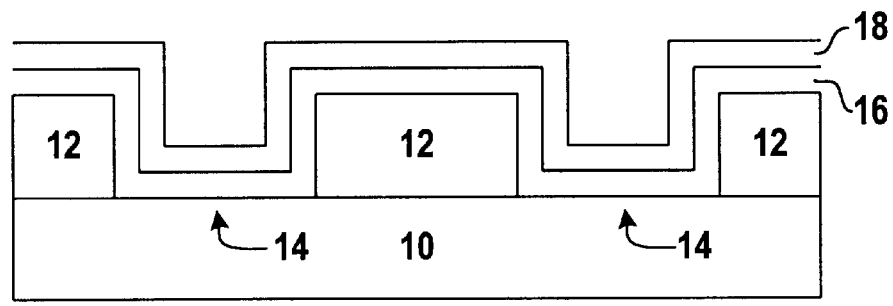
FIG. 1 is a cross sectional view of a substrate with trenches, a barrier layer, and a seed layer.

With reference to FIGS. 1–6, there are shown steps in a method for under bump metallization of a die in accordance with a preferred embodiment of the invention. Beginning with a substrate 10 as depicted in FIG. 1, trenches such as 14 are etched in the substrate 10, such as in a dielectric layer 12. The trenches 14 may be etched such as by plasma etching or wet etching. Most preferably, the trenches 14 expose electrically conductive circuitry that has been formed beneath the dielectric layer 12, and to which electrical connections are desired. In a most preferred embodiment, the substrate 10 is a semiconductor substrate in which integrated circuits are formed, such as a silicon wafer. However, the substrate 10 may alternately be of a different type, as described in more detail below.

A barrier layer 16 is preferably formed over the substrate 10, including within the trenches 14. Most preferably the barrier layer 16 is formed of at least one a material such as tantalum and tantalum nitride. A seed layer 18 is preferably deposited over the barrier layer 16. The seed layer 18 is preferably formed of a first electrically conductive material, which in the most preferred embodiment is copper. The seed layer 18 is also preferably used as an electrode layer for the electroplating of an additional amount of the first electrically conductive material, as described more completely below.

Figure 2:
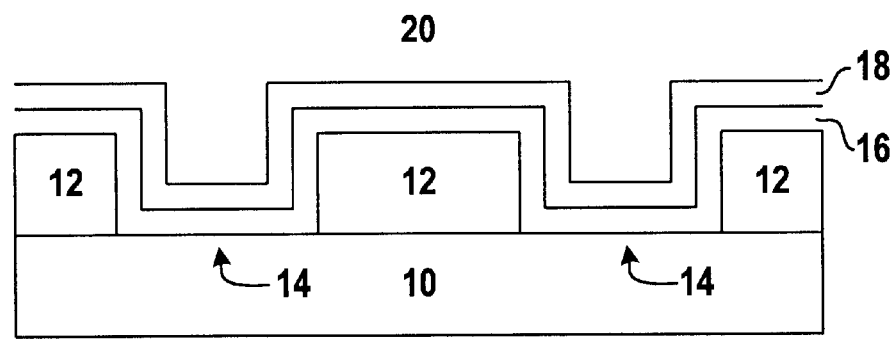
FIG. 2 is a cross sectional view of the substrate of FIG. 1 with a layer of a first electrically conductive material.

Turning next to FIG. 2, a layer of the first electrically conductive material, such as copper layer 20, is applied over the seed layer 18, as by electroplating techniques. The layer 20 of the first electrically conductive material preferably completely fills the trenches, and additionally forms a contiguous sheet of the first electrically conductive material between the trenches 14.

Figure 3:
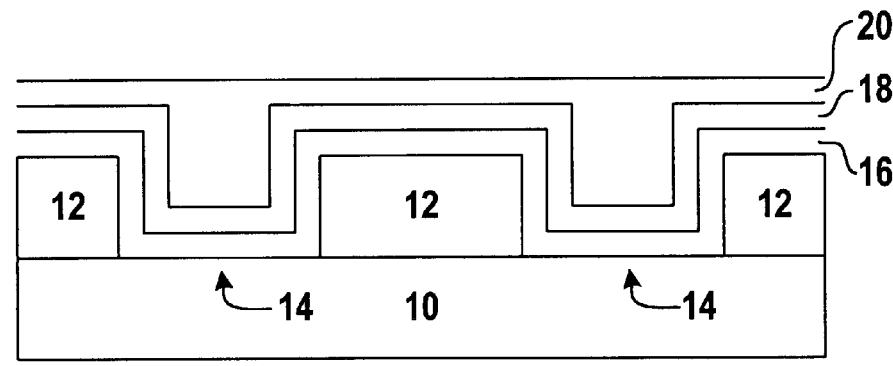
FIG. 3 is a cross sectional view of the substrate of FIG. 2 where the layer of the first electrically conductive material has been thinned.

With reference to FIG. 3, the layer 20 of the first electrically conductive material is thinned to an end point, such as by chemical mechanical polishing techniques. The chemical mechanical polishing is preferably accomplished so as to retain the layer of the first electrically conductive material in a contiguous sheet between the trenches 14 at a thickness of from about one to about three micrometers.

Figure 4:
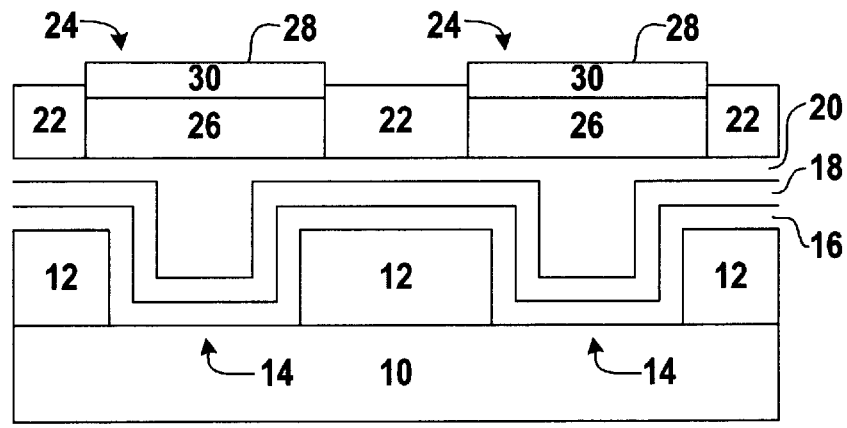
FIG. 4 is a cross sectional view of the substrate of FIG. 3 with a patterned photoresist layer.

With reference to FIG. 4, a layer 22 of photoresist is applied over the first electrically conductive material 20. The photoresist is preferably patterned so as to define openings 24, which openings preferably correspond to the locations of the trenches 14. A second electrically conductive material 26 is then applied, preferably by electroplating, into the openings 24 to form pads 28. Most preferably, the second electrically conductive material 26 is a material such as nickel. In a most preferred embodiment, nickel is electroplated at a thickness of from about two micrometers to about eight micrometers.

Preferably, a third electrically conductive material 30 is electroplated on top of the second electrically conductive material 26. Most preferably the third electrically conductive material 30 is gold, which is electroplated at a thickness of from about three tenths of a micrometer to about three micrometers. The layer 30 of gold preferably covers the nickel layer 26 and inhibits oxidation of the nickel 26. Alternately, solder is electroplated either onto the nickel 26 or directly onto the copper 20.

Figure 5:
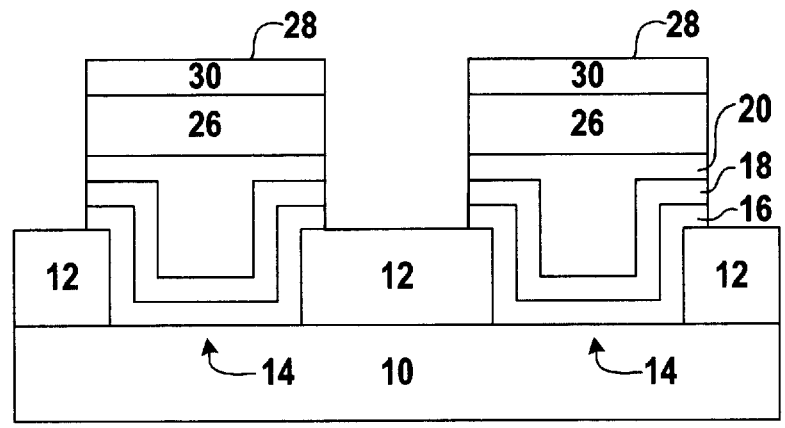
FIG. 5 is a cross sectional view of the substrate of FIG. 4 a second and third electrically conductive material depositing in the openings of the photoresist.

Turning next to FIG. 5, the photoresist layer 22, and the layer of the first electrically conductive material 20 is partially removed as by etching to electrically isolate the electrically conductive layers located in and above the trenches 14.

Figure 6:
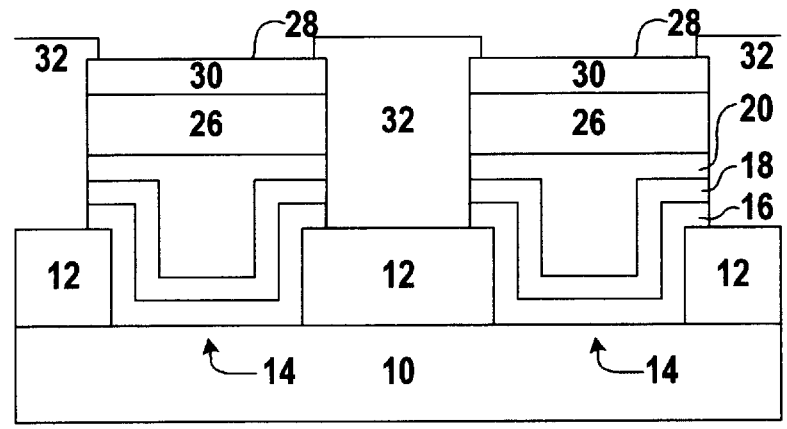
FIG. 6 is a cross sectional view of the substrate of FIG. 5 with a layer of an electrically nonconductive layer overlying the substrate, with opening to the lower electrically conductive layers.

It is appreciated that the method as described above is applicable to wide array of substrates 10. For example, in a most preferred embodiment, the substrate 10 can be a semiconducting substrate, such as a silicon wafer on which many integrated circuits are formed. In such a preferred embodiment, one or more passivation layers 32 are preferably applied and patterned as depicted in FIG. 6. The contact surfaces provided in accordance with the invention as described above are suitable for wire bonding or solder bumping.

However, in alternate embodiments the substrate 10 may be a package substrate to which an integrated circuit is to be mounted. In yet a further embodiment, the substrate 10 may be a circuit board to which an integrated circuit is to be mounted. In these and other similar alternate embodiments, the steps of applying and patterning the passivation layers 32 are preferably not performed. Also in these alternate embodiments, where the substrate 10 is one such as a package substrate or a circuit board, the barrier layer 16 of tantalum or tantalum nitride is preferably not formed. However, this tends to be at least partially dependent upon the material from which the substrate 10 is constructed, and in some embodiments a barrier layer 16 of a different material may be desired, which barrier layer 16 is operable at least in part to reduce or eliminate undesirable interactions between the material of the substrate 10 and the other layers of the under bump metallization stack.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for providing under bump metallization on a substrate, the method comprising the steps of:

forming trenches in the substrate, forming a layer of a first electrically conductive material over the substrate, the layer of the first electrically conductive material completely filling the trenches and substantially covering the substrate between the trenches in a contiguous sheet, thinning the layer of the first electrically conductive material to an end point where the layer of the first electrically conductive material is substantially reduced in thickness but still forms the contiguous sheet between the trenches, applying a photoresist layer over the layer of the first electrically conductive material to define openings, depositing a second electrically conductive material into the openings, removing the photoresist layer, and removing the layer of the first electrically conductive material in the contiguous sheet between the trenches to isolate the first electrically conductive material in the trenches.

2. The method of claim 1, further comprising the step of forming a barrier layer over the substrate prior to the step of forming the layer of the first electrically conductive material over the substrate.

3. The method of claim 2, wherein the barrier layer comprises a composite layer of tantalum and tantalum nitride.

4. The method of claim 1, further comprising the steps of forming a barrier layer over the substrate and forming a seed layer over the barrier layer prior to the step of forming the layer of the first electrically conductive material over the substrate.

5. The method of claim 4, wherein the barrier layer comprises a composite layer of tantalum and tantalum nitride.

6. The method of claim 4, wherein the seed layer comprises the first electrically conductive material.

7. The method of claim 1 wherein the first electrically conductive material comprises copper.

8. The method of claim 1 wherein the second electrically conductive material comprises nickel.

9. The method of claim 1 further comprising the step of depositing a third electrically conductive material in the openings after the step of depositing a second electrically conductive material in the openings.

10. The method of claim 9 wherein the third electrically conductive material comprises gold.

11. The method of claim 9 wherein the third electrically conductive material comprises solder.

12. The method of claim 1 wherein the step of forming the layer of the first electrically conductive material over the substrate comprises electroplating the layer of the first electrically conductive material.

13. The method of claim 1 wherein the step of thinning the layer of the first electrically conductive material comprises chemical mechanically polishing the layer of the first electrically conductive material.

14. The method of claim 1 wherein the step of depositing a second electrically conductive material into the openings comprises electroplating the second electrically conductive material.

15. The method of claim 1, further comprising the steps of:

depositing a layer of electrically nonconductive material over the substrate, and etching the layer of electrically nonconductive material to expose the second electrically conductive material overlying the trenches.

16. A method for providing under bump metallization on a substrate, the method comprising the steps of:

forming trenches in the substrate, forming a barrier layer over the substrate, forming a seed layer of a first electrically conductive material over the barrier layer, electroplating a conduction layer of the first electrically conductive material over the seed layer, the layer of the first electrically conductive material completely filling the trenches and substantially covering the substrate between the trenches in a contiguous sheet, chemical mechanically polishing the layer of the first electrically conductive material to an end point where the layer of the first electrically conductive material is substantially reduced in thickness but still forms the contiguous sheet between the trenches, applying a photoresist layer over the layer of the first electrically conductive material to define openings, electroplating a second electrically conductive material into the openings, electroplating a third electrically conductive material in the openings, and removing the layer of the first electrically conductive material in the contiguous sheet between the trenches to isolate the first electrically conductive material in the trenches.

17. The method of claim 16, wherein the first electrically conductive material comprises copper.

18. The method of claim 16, further comprising the steps of:

depositing a layer of electrically nonconductive material over the substrate, and etching the layer of electrically nonconductive material to expose the third electrically conductive material overlying the trenches.

* * * * *